United States Patent [19]

Mandai et al.

[11] Patent Number: 5,237,296

[45] Date of Patent: Aug. 17, 1993

[54] COMPOSITE ELECTRONIC PARTS HAVING OPEN-CIRCUITS STUB AND SHORT-CIRCUITED STUB

[75] Inventors: Harufumi Mandai; Yoshikazu Chigodo; Atsushi Tojo, all of Nagaokakyo, Japan

[73] Assignee: Murata Manufacturing Co, Ltd., Japan

[21] Appl. No.: 859,350

[22] Filed: Mar. 30, 1992

[30] Foreign Application Priority Data

Mar. 28, 1991 [JP] Japan .................................. 3-64406

[51] Int. Cl.⁵ .......................... H01P 9/00; H01L 27/00
[52] U.S. Cl. ................................. 333/161; 333/204; 333/263
[58] Field of Search ............... 333/138, 140, 156, 161, 333/204, 219, 246, 185, 263

[56] References Cited

U.S. PATENT DOCUMENTS

| | | | |
|---|---|---|---|
| 3,701,958 | 10/1972 | Jaag | 333/185 |
| 4,758,922 | 7/1988 | Ichigaki et al. | 333/204 X |
| 4,942,373 | 7/1990 | Ozawa et al. | 333/161 |

FOREIGN PATENT DOCUMENTS

| | | | |
|---|---|---|---|
| 0143403 | 6/1989 | Japan | 333/156 |
| 0125504 | 5/1991 | Japan | 333/156 |

Primary Examiner—Robert J. Pascal
Assistant Examiner—Seung Ham
Attorney, Agent, or Firm—Ostrolenk, Faber, Gerb & Soffen

[57] ABSTRACT

This composite electronic part comprises a dielectric layer on which earth electrodes are formed, a dielectric layer on which conductive lines are formed, and a dielectric layer on which electronic parts are pattern-formed. A plurality of the dielectric layers are so laminated that the dielectric layer with the earth electrodes is disposed next to the dielectric layer with the conductive lines. These conductive lines and earth electrodes form strip lines. A short-stub or an open-stub is formed by connecting one end of the conductive line to the earth electrode or opening that one end. A composite electronic part is obtained by connecting the short-stub, open-stub, and the electronic parts.

18 Claims, 5 Drawing Sheets

COMPOSITE ELECTRONIC PARTS HAVING OPEN-CIRCUITS STUB AND SHORT-CIRCUITED STUB

BACKGROUND OF THE INVENTION

1. Field of the Invention

This invention relates to composite electronic parts such as a filter, a timing extraction circuit, or a differentiating circuit.

2. Description of the Prior Art

As to filters, the structures shown in FIGS. 5 and 6 are conventionally known. In the structure shown in FIG. 5, an open-stub 32 and a short-stub 33 are formed on a dielectric substrate 31 on the under-surface of which an earth electrode is formed. The open-stub 32, short-stub 33 and the like are pattern-formed by, e.g., printing. One end of the short-stub 33 is connected to the earth electrode via a through-hole 37. Further, on the dielectric substrate 31, chip resistors 35, 36 are carried. And wiring 34 is pattern-formed so that it connects these chip resistors 35, 36, open-stub 32 and short-stub 33. The wiring 34 and the chip resistors 35, 36 are electrically connected by, e.g., soldering.

Still further, in the structure shown in FIG. 6, chip-type delay lines 43, 44 and chip resistors 45, 46 are carried on a dielectric substrate 41 on which wiring 42 is formed with a predetermined pattern, and these chip parts and the wiring 42 are electrically connected by, e.g., soldering.

However, the conventional filters mentioned above have problems as follows. That is, the former has a hood high-frequency characteristic because of using the open-stub 32 and the short-stub 33 which are pattern-formed, but the former requires a wide substrate area for pattern-forming of these stubs, thereby resulting in a large size. Furthermore, a filter like this has a disadvantage of being unable to adjust the frequency characteristic.

The latter uses the chip-type delay lines 43, 44 instead of the open-stub and short-stub, and thus requires only a smaller substrate area than that of the former, and further is able to adjust frequency by replacing the delay lines 43, 44 with other chips, but has the disadvantages of a worse high-frequency characteristic than that of the former and an increase in the number of parts.

SUMMARY OF THE INVENTION

The present invention was attained to solve such problems and is to provide a composite electronic part having a superior high-frequency characteristic and the advantage of miniaturization.

The present invention is a composite electronic part which is laminated with dielectric layers on which a short-stub and/or an open stub of a strip line are formed and a dielectric layer on which electronic parts are pattern-formed.

In this composite electronic part, a strip line is comprised of a conductive line and an earth electrode which are formed interposing a dielectric layer between them.

This conductive line may be formed on plural dielectric layers, and these conductive lines formed in such a way are connected via through-holes formed through the dielectric layers.

In this composite electronic part, the short-stub and/or open-stub and the electronic parts are pattern-formed on the dielectric layers and these dielectric layers are laminated.

According to the present invention, the short-stub and/or open-stub and the electronic parts are formed into a laminate, and thus the composite part can be miniaturized to about less than 1/5 in area as compared with the case of FIG. 5 in which the short-stub and open stub are pattern-formed on the same substrate, and moreover can be miniaturized to about less than ¼ in area as compared with the case of FIG. 6 in which the part is fabricated from discrete parts. Still further, the short-stub and open-stub are formed of strip lines, thus the composite electronic part of the present invention can have a superior high-frequency characteristic as compared with a composite electronic part using chip-type delay lines.

The above and further objects, features, aspects, and advantages of the invention will be more fully apparent from the following detailed description with the accompanying drawings.

DESCRIPTION OF THE PREFERRED EMBODIMENTS

Figure 1:
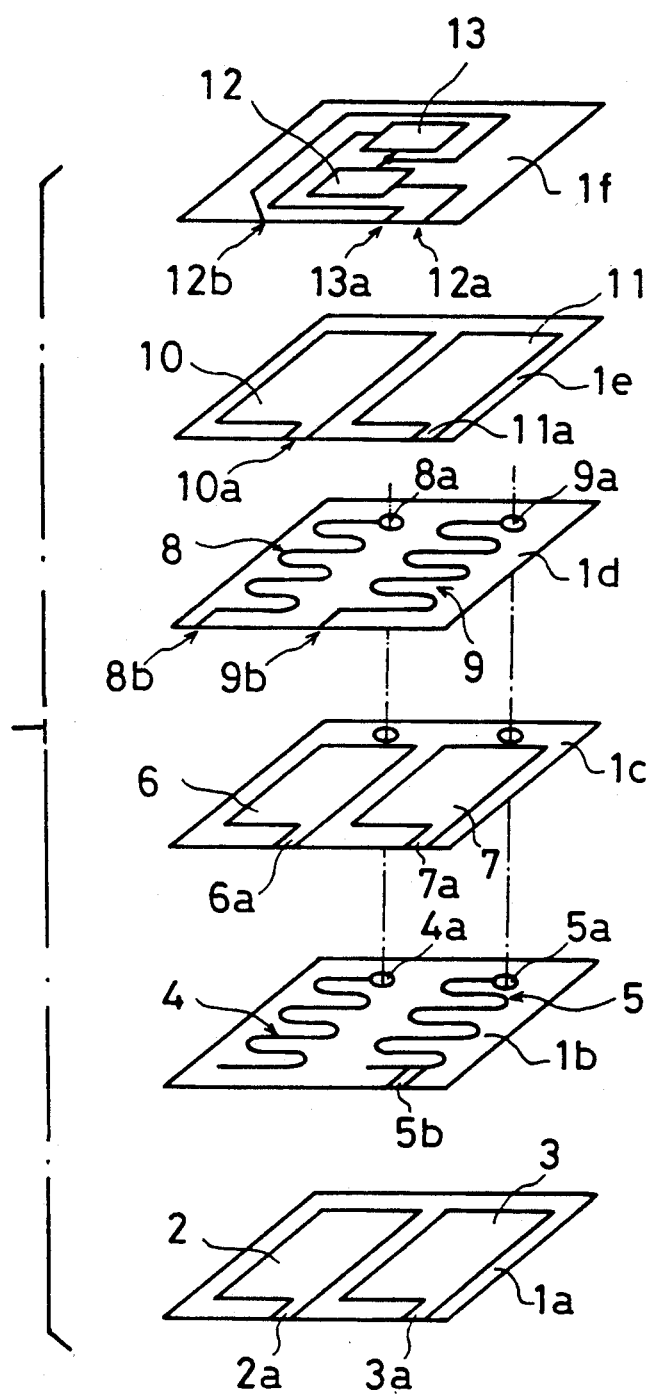
FIG. 1 is an exploded perspective view showing one embodiment in which the present invention is applied to a filter.

The present invention will be concretely described referring to the accompanying drawings. FIG. 1 is an exploded perspective view showing an embodiment in which the present invention is applied to a filter. This filter includes a dielectric layer 1a on which two planar earth electrodes 2, 3 are formed. Connecting terminals 2a, 3a are formed from the earth electrodes 2, 3 toward an end of the dielectric layer 1a. On the dielectric layer 1a, a dielectric layer 1b is disposed on which two winding conductive lines 4, 5 are formed. These conductive lines 4, 5 are so formed that both their ends are positioned within the ends of the dielectric layer 1b. A connecting terminal 5b is formed which extends from one end of one conductive line 5 to one end of the dielectric layer 1b. On the dielectric layer 1b, a dielectric layer 1c is disposed on which two planar earth electrodes 6, 7 are formed. Connecting terminals 6a, 7a are formed from these earth electrodes 6, 7 toward one end of the dielectric layer 1c.

On the dielectric layer 1c, a dielectric layer 1d is disposed on which two winding conductive lines 8, 9 are formed. These conductive lines 8, 9 are so formed that their first ends 8a, 9a are positioned within one end of the dielectric layer 1d. And the other ends 8b, 9b of the conductive lines 8, 9 are extended to the other end of the dielectric layer 1d. On the dielectric layer 1d, a dielectric layer 1e is disposed on which two planar earth electrodes 10, 11 are formed. Connecting terminals 10a, 11a are formed from these earth electrodes 10, 11 toward one end of the dielectric layer 1e.

On the dielectric layer 1e, a dielectric layer 1f is disposed on which two resistance electrodes 12, 13 are formed. Connecting patterns 12a, 12b, and 13a are extended from these resistance electrodes 12, 13 toward one end of the dielectric layer 1f. The connecting pattern 12a is connected to the resistance electrode 12, and the connecting pattern 13a is connected to the resistance electrode 13. The connecting pattern 12b is also connected to a common inter-connection point of the resistance electrodes 12 and 13. For the electrodes 2, 3 or the like as mentioned above, a conductive material such as Cu is used. These six dielectric layers 1a–1f are laminated, disposing respective electrodes 2, 3 and the like upwardly.

In a state of lamination of these dielectric layers, through-holes which connect one end 8a of the conductive line 8 and one end 4a of the conductive line 4 are formed in the two dielectric layers 1c and 1d which are in an almost central position of the laminate. Thus current is conducted between one end 8a of the conductive line 8 and one end 4a of the conductive line 4 via a conductive material such as Cu filled in the through-holes. Similarly, through-holes which connect one end 9a of the conductive line 9 and one end 5a of the conductive line 5 are formed in the dielectric layers 1c and 1d. And current conducts between one end 9a of the conductive line 9 and one end 5a of the conductive line 5 via a conductive material such as Cu filled in the through-holes.

Furthermore, in a state of lamination of the dielectric layers 1a–1f, four outside electrodes (not shown) are formed on the side surfaces of the dielectric layers laminate. One outside electrode connects the connecting terminal 3a of the earth electrode 3, connecting terminal 5b extended from the conductive line 5, connecting terminal 7a of the earth electrode 7, connecting terminal 11a of the earth electrode 11, and the connecting pattern 12a extended from the resistance electrode 12. Another outside electrode connects the end 9b extended from the conductive line 9 and the connecting pattern 13a extended from the resistance electrode 13. A further outside electrode connects the connecting terminal 2a of the earth electrode 2, connecting terminal 6a of the earth electrode 6, and the connecting terminal 10a of the earth electrode 10. Still another outside electrode connects the end 8b extended from the conductive line 8 and the connecting pattern 12b extended from the common portion of the two resistance electrodes 12, 13.

Figure 2:
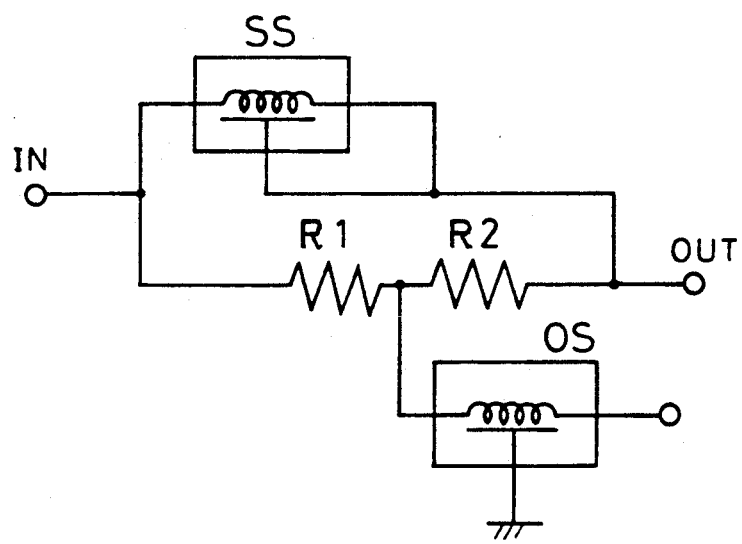
FIG. 2 is an equivalent circuit diagram of the filters shown in FIGS. 1 and 3.

Thereby, strip lines are formed between the conductive lines 4, 5 and the earth electrodes 2, 3 or the earth electrodes 6, 7 which are on one side of the conductive lines 4, 5. Similarly, strip lines are formed between the conductive lines 8, 9 and the earth electrodes 6, 7 or the earth electrodes 10, 11. Each of the earth electrodes 2, 6, 10 also functions as an earth. Using the outside electrode connected to the connecting pattern 13a as an input terminal (IN), and using the outside electrode connected to the connecting pattern 12a as an output terminal (OUT), the conductive lines 5, 9 connected by the through-holes form a short-stub, and similarly the conductive lines 4, 8 connected by the through-holes form an open-stub. Thus, a filter having the equivalent circuit of FIG. 2 is configured. In FIG. 2, OS indicates an open-stub, SS denotes a short-stub, and R1, R2 represent resistances comprised of the resistance electrodes 12, 13 respectively.

In a filter configured by the present invention, the short-stub, open-stub and the other electronic parts, that is, resistors are formed into a laminate, thus the filter of the invention can be miniaturized as compared with a filter in which resistors and stubs are formed on the same substrate. Furthermore, in a filter of the present invention, a short-stub and open-stub are formed of strip lines, thus the filter can have a superior high-frequency characteristic as compared with a filter using chip-type delay lines. Still further, both the short-stub and the open-stub are included in one chip, thus the effect on dispersion of filter quality can be reduced when filters are produced.

Figure 3:
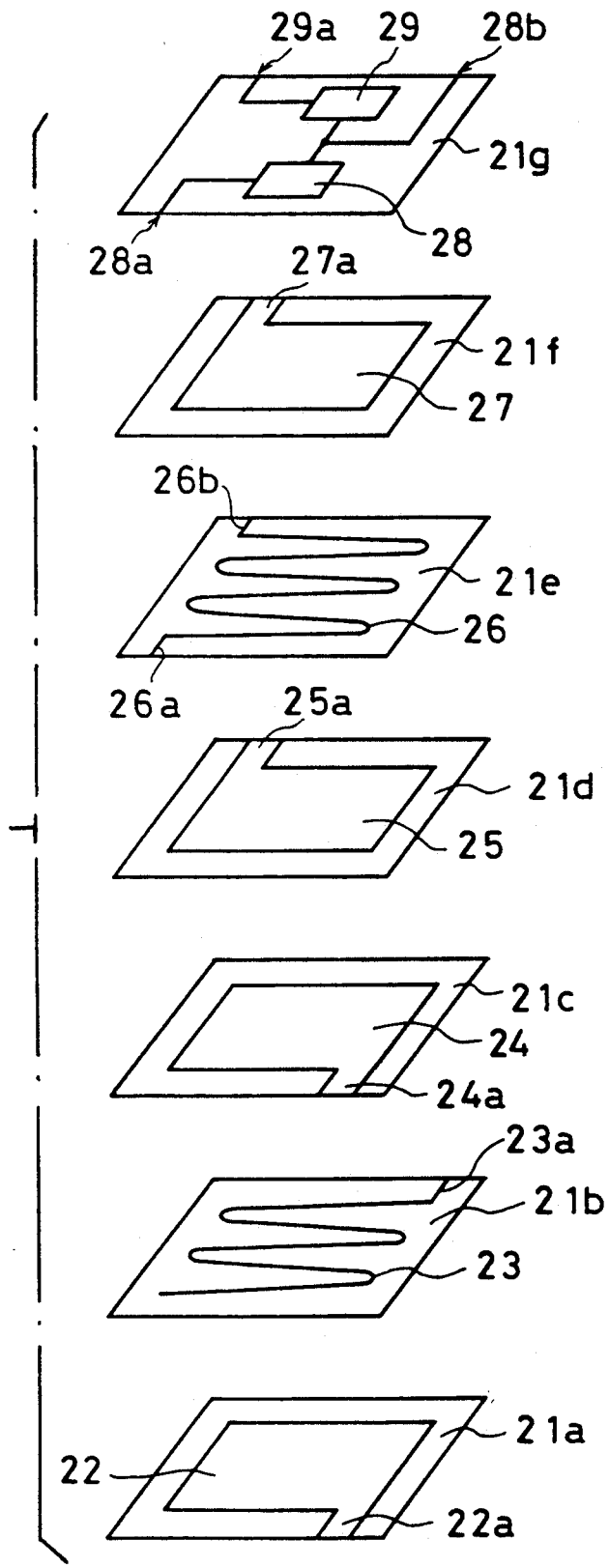
FIG. 3 is an exploded perspective view showing another embodiment in which the present invention is applied to a filter.

FIG. 3 is an exploded perspective view showing another embodiment in which the present invention is applied to a filter. This filter includes a dielectric layer 21a on which one planar earth electrode 22 is formed. A connecting terminal 22a is formed from the earth electrode 22 toward one end of the dielectric layer 21a. On the dielectric layer 21a, a dielectric layer 21b is disposed on which one winding conductive line 23 is formed. One end of this conductive line 23 is so formed that it is within one end of the dielectric layer 21b, and the other end 23a is extended to the other end of the dielectric layer 21b.

On the dielectric layer 21b, a dielectric layer 21c is disposed on which one planar earth electrode 24 is formed. A connecting terminal 24a is formed from the earth electrode 24 toward one end of the dielectric layer 21c. Moreover, on the dielectric layer 21c, a dielectric layer 21d is disposed on which one planar earth electrode 25 is formed. A connecting terminal 25a is formed from this earth electrode 25 toward one end of the dielectric layer 21d. This connecting terminal 25a and the connecting terminal 24a formed on the underside of dielectric layer 21c are extended in opposite directions respectively.

On the dielectric layer 21d, a dielectric layer 21e is disposed on which one winding conductive line 26 is formed. Both ends 26a, 26b of the conductive line 26 are respectively extended to the two opposing ends of the dielectric layer 21e. On the dielectric layer 21e, a dielectric layer 21f is disposed on which one planar earth electrode 27 is formed. A connecting terminal 27a is formed from the earth electrode 27 toward one end of the dielectric layer 21f.

On the dielectric layer 21f, a dielectric layer 21g is disposed on which two resistance electrodes 28, 29 are formed. From the resistance electrode 28 toward one end of the dielectric layer 21g, a connecting pattern 28a is extended, and from the resistance electrode 29 toward the other end of the dielectric layer 21g, a connecting pattern 29a is extended. Furthermore, connecting pattern 28b is extended from a common portion of the resistance electrodes 28, 29 toward the other end of the dielectric layer 21g. The above electrodes 22, 24 and the like are made of a conductive material such as Cu. These seven dielectric layers 21a–21g are laminated, disposing the electrodes 22, 24 and the like upwardly.

In a state of lamination of these dielectric layers, four outside electrodes are formed on side surfaces of the dielectric layer laminate. One outside electrode connects the connecting terminal 22a formed at one end of the earth electrode 22 and the connecting terminal 24a formed at one end of the earth electrode 24. Another outside electrode connects one end 26a of the conductive line 26 and the connecting pattern 28a extended from the resistance electrode 28. Still another outside electrode connects the other end 26b of the conductive line 26, connecting terminals 25a, 27a formed at one ends of the earth electrode 25, 27 respectively, and the connecting pattern 29a extended from the resistance electrode 29. And other outside electrode connects the end 23a of the conductive line 23 and the connecting pattern 28b extended from the common portion of the two resistance electrodes 28, 29.

Thereby, a strip line is formed between the conductive line 23 and the earth electrode 22 or 24 existing on one side of the conductive line 23, and a strip line is also formed between the conductive line 26 and the earth electrode 25 or 27 existing on one side of the conductive line 26. Each of the earth electrodes 22, 24 functions as an earth. And, using the outside electrode connected to the pattern 28a as an input terminal (IN), and using the outside electrode connected to the connecting pattern 29a as an output terminal (OUT), the conductive line 26 forms a short-stub, and the conductive line 23 forms an open-stub. Even a filter configured in this manner has the equivalent circuit of FIG. 2 and develops the same effect.

Figure 4A:
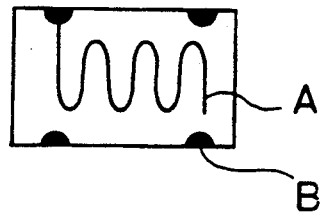
FIG. 4(a) is a plan view showing a relation of position between an end of an open-stub and an outside electrode used in the present invention.
Figure 4B:
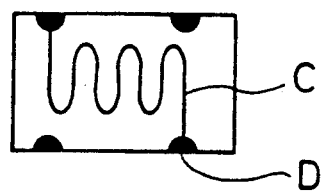
FIG. 4(b) is a plan view showing a relation of position between an end of a delay line and a take-out electrode used in a conventional filter.
Figure 5:
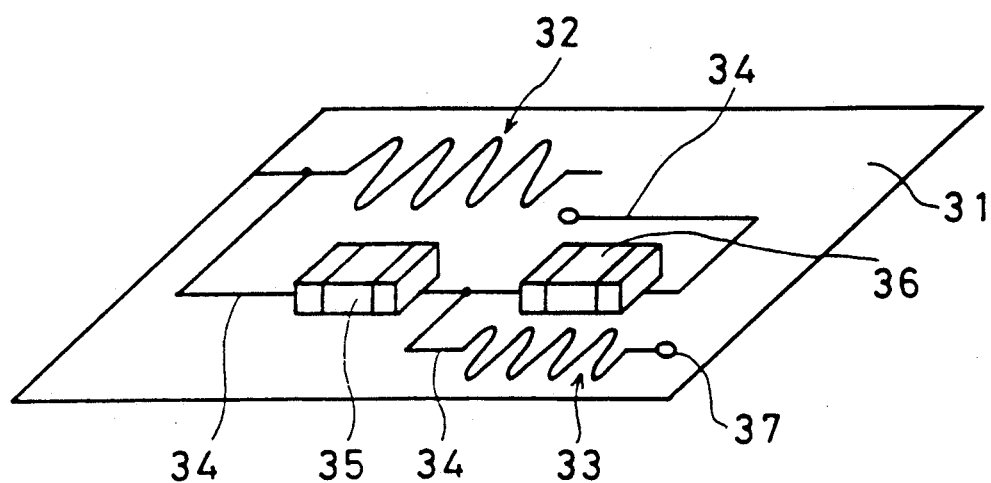
FIG. 5 is a perspective view showing a structure of a conventional filter.
Figure 6:
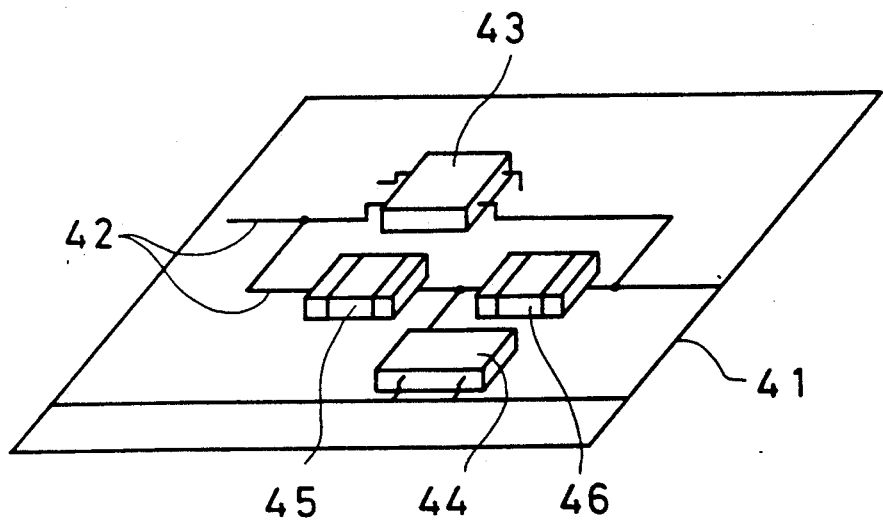
FIG. 6 is a perspective view showing another structure of a conventional filter.

Meanwhile, in the above two embodiment, that is, in the cases of FIGS. 1 and 3, and end A of the open-stub is apart from an outside electrode B as shown in FIG. 4(a). When configured in this manner, this configuration has advantages since termination of the stub becomes good and the high-frequency characteristic can be improved as compared with a case in which an end of a line C is extended to a take-out electrode D and the take-out electrode D is opened as shown in FIG. 4(b).

In the embodiments of FIGS. 1 and 3, this invention is applied to filters, thus the resistors are formed of electrode films, but this invention also can be applied to other composite electronic parts besides filters. In this case, capacitors and inductors in place of resistors can be formed of electrode films.

Moreover, in the embodiments of FIGS. 1 and 3, the outside electrodes are formed on the side surfaces of the dielectric layers laminate and this enables surface packaging, but the invention is not limited to such a case and the invention also is applicable to a structure in which lead terminals are taken out from a molded resin package-molding.

Furthermore, in the embodiments of FIGS. 1 and 3, the structure is shown which has the short-stub and open-stub on the same chip, but the invention is not limited to such a case and enables to make a structure in which only the short-stub and the electronic parts or only the open-stub and the electronic parts are incorporated in one chip, depending upon a type of composite electronic part.

It will be apparent from the foregoing that, while the present invention has been described in detail and illustrated, these are only particular illustrations and examples and the invention is not limited to these. The spirit and scope of the invention is limited only by the appended claims.

What is claimed is:

1. A composite electronic part having a short-circuited stub and an open-circuited stub, said composite electronic part comprising a laminate having at least one dielectric layer on which a short-circuited strip line stub and an open-circuited strip line stub are formed, at least another dielectric layer on which at least one electronic part is pattern-formed, and conductors interconnecting said open-circuited stub, said short-circuited stub and said electronic part.

2. A composite electronic part according to claim 1, wherein each said strip line stub is comprised of a conductive line and an earth electrode which are disposed in said laminate with a dielectric layer interposed between them.

3. A composite electronic part according to claim 2, wherein each said conductive line is formed in sections on a plurality of said dielectric layers and said sections of said conductive lines are connected via throughholes formed in said dielectric layers.

4. A composite electronic part according to claim 2, wherein said electronic parts are resistors.

5. A composite electronic part according to claim 2, wherein said electronic parts are capacitors.

6. A composite electronic part according to claim 2, wherein said electronic parts are inductors.

7. A composite electronic part according to claim 3, wherein said electronic parts are resistors.

8. A composite electronic part according to claim 3, wherein said electronic parts are capacitors.

9. A composite electronic part according to claim 3, wherein said electronic parts are inductors.

10. A composite electronic part comprising:
a laminate formed from a plurality of dielectric layers;
a short-circuited stub and an open-circuited stub, which are formed by respective strip lines on at least a first one of said dielectric layers;
at least one electronic part pattern-formed on at least a second one of said dielectric layers; and
conductors interconnecting said short-circuited stub, said open-circuited stub, and said electronic part.

11. A composite electronic part according to claim 10, wherein each said strip line comprises a conductive line formed on at least said first one of said dielectric layers, and an earth electrode formed on an adjacent third one of said dielectric layers.

12. A composite electronic part according to claim 11, wherein each of said conductive lines is formed in sections on a respective plurality of dielectric layers, and said sections are interconnected by conductive throughholes which are formed in said laminate extending therebetween.

13. A composite electronic part according to claim 12, wherein said electronic part is formed on a dielectric layers other than those on which said conductive lines are formed.

14. A composite electronic part according to claim 12, wherein each section of said open-circuited stub is formed on a common dielectric layer with a corresponding section of said short-circuited stub.

15. A composite electronic part according to claim 14, wherein said electronic part is formed on a dielectric layer other than those on which said conductive lines are formed.

16. A composite electronic part according to claim 11, wherein each of said conductive lines is formed on a respective one of said plurality of dielectric layers.

17. A composite electronic part according to claim 16, wherein said electronic part is formed on a dielectric layer other than those on which said conductive lines are formed.

18. A composite electronic part according to claim 10, wherein each said strip line comprises a conductive line formed on at least said first one of said dielectric layers, and an earth electrode, one of said dielectric layers being interposed between said conductive line and said earth electrode.

* * * * *